(12) United States Patent
Lee

(10) Patent No.: US 7,964,965 B2
(45) Date of Patent: Jun. 21, 2011

(54) FORMING THICK METAL INTERCONNECT STRUCTURES FOR INTEGRATED CIRCUITS

(75) Inventor: Kevin J. Lee, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 295 days.

(21) Appl. No.: 12/059,000

(22) Filed: Mar. 31, 2008

(65) Prior Publication Data

US 2009/0243104 A1  Oct. 1, 2009

(51) Int. Cl.
*H01L 21/768* (2006.01)
*H01L 23/532* (2006.01)

(52) U.S. Cl. ......................... 257/751; 438/618

(58) Field of Classification Search ............... 257/751, 257/E21.584, E23.161; 438/618, 627
See application file for complete search history.

(56) References Cited

U.S. PATENT DOCUMENTS

| 6,020,266 | A | 2/2000 | Hussein et al. |
| 6,384,481 | B1 | 5/2002 | Hussein et al. |
| 6,943,440 | B2 | 9/2005 | Kim et al. |
| 6,977,435 | B2 | 12/2005 | Kim et al. |
| 7,498,252 | B2 | 3/2009 | Lee et al. |
| 7,732,936 | B2 | 6/2010 | Goodner et al. |
| 2005/0250323 | A1 | 11/2005 | Barnak et al. |
| 2006/0012039 | A1 | 1/2006 | Kim et al. |
| 2008/0003715 | A1 | 1/2008 | Lee et al. |
| 2008/0171431 | A1* | 7/2008 | Yu et al. .................. 438/618 |
| 2009/0057842 | A1 | 3/2009 | He et al. |
| 2009/0133908 | A1 | 5/2009 | Goodner et al. |
| 2009/0315180 | A1* | 12/2009 | Lee .......................... 257/751 |
| 2010/0155946 | A1 | 6/2010 | Lee et al. |

OTHER PUBLICATIONS

"Wafer-Level Packaging Has Arrived", Dr. Philip Garrou, IEEE Components, Packaging and Manufacturing Technologies Society—Semiconductor International, Oct. 1, 2000, 8 pgs. Also found at http://www.semiconductor.net/article/CA47705.html.

"Interconnect Structure for a Microelectronic Device, Method of Manfacturing Same, and Microelectronic Structure Containing Same", Michael Goodner, et al., U.S. Appl. No. 11/946,599, filed Nov. 28, 2007.

"Systems and Methods to Passivate On-Die Redistribution Interconnects", Jun He, et al., U.S Appl. No. 11/595,645, filed Nov. 8, 2005.

* cited by examiner

*Primary Examiner* — Fernando L Toledo
(74) *Attorney, Agent, or Firm* — Scott M. Lane

(57) ABSTRACT

Embodiments of an apparatus and methods for forming thick metal interconnect structures for integrated structures are generally described herein. Other embodiments may be described and claimed.

6 Claims, 6 Drawing Sheets

FORMING THICK METAL INTERCONNECT STRUCTURES FOR INTEGRATED CIRCUITS

FIELD OF THE INVENTION

The field of invention relates generally to the field of semiconductor integrated circuit manufacturing and, more specifically but not exclusively, relates to CMOS (complementary metal oxide semiconductor) devices with thick metal interconnect structures formed in photodefinable dielectric layers without an application of a passivation film on the thick metal interconnect structures.

BACKGROUND INFORMATION

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects".

One process used to form interconnects is known as a "damascene process". In a typical damascene process, a photoresist material is patterned on a dielectric material and the dielectric material is etched through the photoresist material patterning to form a hole, a trench or a via (hereinafter collectively referred to as "an opening" or "openings"). The photoresist material is then removed and the opening is then filled with a conductive material (e.g., such as a metal or metal alloys such as copper or a copper alloy) to form a conductive region for connection to other conductive means. The filling of the opening may be accomplished by either physical vapor deposition, chemical vapor deposition, or electroplating, as will be understood to those skilled in the art. The term "interconnect" is defined herein to include all interconnection components including trenches and vias filled with conductive material.

Subsequent layers deposited adjacent to the conductive regions are selected to avoid delamination and contamination issues resulting from electromigration (EM). Where copper has been deposited, an intervening layer such as silicon nitride is formed on the conductor or conductive region to provide a suitable interface for the deposition of one or more dielectric layers, such as a spin on dielectric layer. Application of a silicon nitride interface film is typically performed using chemical vapor deposition methods in chambers operating at 400 C or above. In some cases, dielectric films used in the formation of the conductive regions are limited to temperatures at or below 270 C, making these films incompatible with temperatures inherent to chemical vapor deposition processes.

BRIEF DESCRIPTION OF THE DRAWINGS

The present invention is illustrated by way of example and not as a limitation in the figures of the accompanying drawings, in which.

DETAILED DESCRIPTION

An apparatus and methods for forming thick metal interconnect structures are described in various embodiments. In the following description, numerous specific details are set forth such as a description of a method to fabricate thick metal interconnect structures without the use of a passivating film to enhance adhesion of dielectric films formed adjacent to the interconnect structures and/or conductive regions. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

It would be an advance in the art to reduce the number of layers or steps in the fabrication of a microelectronic device. Reducing the number of layers or steps reduces manufacturing complexity and related costs, including reducing the opportunity for mis-processing and the creation of waste product or scrap. Use of a method to fabricate thick metal interconnect structures without the use of a passivating film to enhance adhesion of dielectric films, including photodefinable dielectric films, formed adjacent to the interconnect structures would provide an alternative to more costly and complex manufacturing methods and devices. Further, elimination of the passivating film avoids exposing the dielectric film to high temperatures normally used in the formation of the passivating film, which can be equal to or greater than 400 C.

One such method may comprise depositing a photodefinable dielectric layer directly adjacent to a first conductor fabricated on a device. The photodefinable dielectric layer is patterned to expose a top surface of the first conductor. A seed layer is formed over the patterned photodefinable dielectric layer and the top surface of the first conductor. A mask layer is deposited on the seed layer and the mask layer is patterned to expose the seed layer over the first conductor. A second conductor is formed on the seed layer over the first conductor to provide a conducting means.

Figure 1:
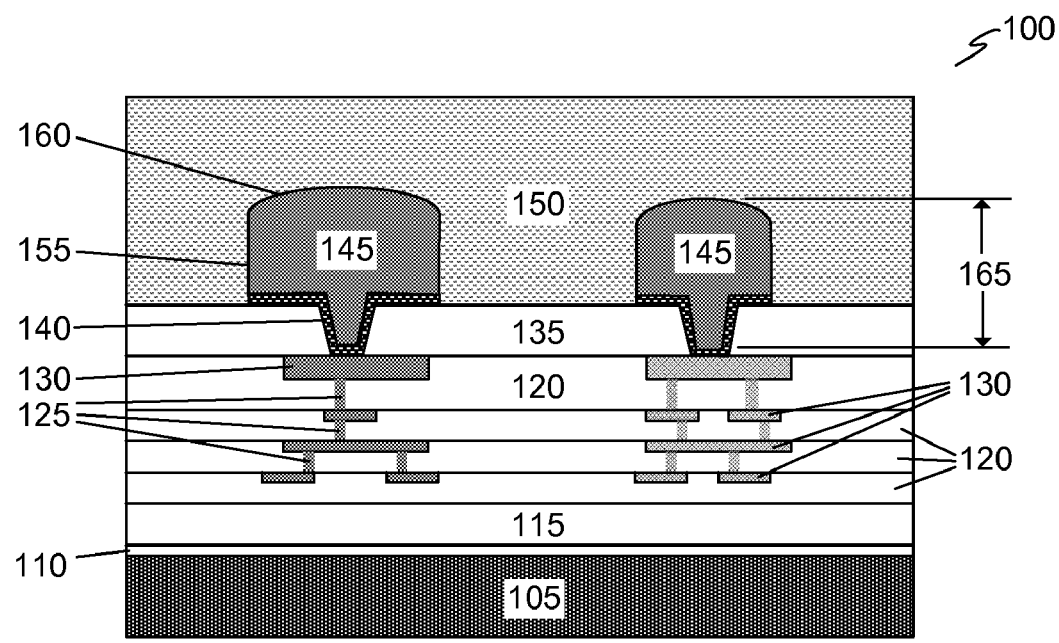
FIG. 1 is an illustration of a cross-sectional view of a device with a photodefinable dielectric layer deposited directly adjacent to a first conductor.

Turning now to the figures, the illustration in FIG. 1 is an illustration of a cross-sectional view of a device 100 with a photodefinable dielectric layer 150 over a top surface 160 of a first conductor 145. The photodefinable dielectric layer 150 may be a material used to electrically isolate conductors and reduce resistance capacitance ("RC") delay and improve device 100 performance, such as InterVia™ 8000-series photodefinable dielectric materials from Rohm and Haas; Cyclotene™ 4000-series photodefinable dielectric materials from Dow Chemical; SU-8 photodefinable epoxy materials from Microchem; WL-5000 series photodefinable silicone dielectric materials from Dow Corning; Avatrel® photodefinable dielectric materials from Promerus; SINR-series photodefinable dielectric materials from ShinEtsuMicroSi; SUMIRESIN EXCEL® CRC-8600 series photodefinable dielectric materials from Sumitomo Bakelite Co, Ltd.; AP2210, AN-3310 and Durimide 7000-series photodefinable polyimide materials from FujiFilm; Photoneece™ photodefinable polyimide materials from Toray; Pimel™ photodefinable polyimide materials from Asahi Kasei EMD; photodefinable polyimide materials from HD Microsystems; TMMR S2000 photodefinable dielectric material from Tokyo Ohka Kogyo Co. Ltd.; or WPR-series photodefinable dielectric materials from JSR Micro, Inc., many of which are low thermal decomposition temperature dielectric materials. Low thermal decomposition temperature dielectric materials are used to form low thermal decomposition temperature layers that may begin to decompose at approximately 270 degrees Celsius (C) or less.

The photodefinable dielectric layer 150 is a material that may be patterned like photoresist and thermally cured so that the photodefinable dielectric layer 150 may be embedded in the device 100. The photodefinable dielectric layer 150 contains light sensitive component(s) that impart a photodefinable characteristic to a dielectric material such that when portions of the film are exposed to light, a difference in the solubility of the dielectric material in the developer solution is set up between the portions of the film that are exposed to light vs. the portions that are unexposed.

The device 100 contains a substrate 105 that may comprise silicon, gallium arsenide (GaAs), or indium antimonide (InSb) in monocrystalline form. The substrate may further comprise buried layers such as a silicon on insulator layer. One or more front end films are formed on the substrate 105 to form a front end layer. The front end layer 110 may comprise one or more films typically used in contemporary device fabrication known to one skilled in the art, such as silicon oxide, silicon nitride, doped or un-doped polysilicon, lanthanum oxide, tantalum oxide, titanium oxide, hafnium oxide, zirconium oxide, lead-zirconate-titanate (PZT), barium-strontium-titanate (BST), or aluminum oxide. The front end layer 110 may be deposited using methods such as thermal deposition, plasma enhanced chemical vapor deposition (PECVD), high density chemical vapor deposition (HD-CVD), and/or sputtering.

One or more back end films are formed on the front end layer 110 for forming a back end layer 115. The back end layer may comprise one or more dielectric and/or metallic films such as tungsten, tantalum, titanium and/or nitrides and alloys thereof. The back end layer 115 may be deposited using methods such as plasma enhanced chemical vapor deposition (PECVD), high density chemical vapor deposition (HD-CVD), and/or sputtering.

A series of interlayer dielectric layers 120 comprising via interconnects 125 and trench interconnects 130 are formed over the back end layer 115 to provide a conductive pathway to the underlying front end layer 110. The interlayer dielectric layers 120 may comprise a silicon oxide, silicon nitride, or a low k dielectric (e.g., k<3) such as carbon-doped oxide (CDO). The interlayer dielectric layers 120 may be planarized, or polished using a process such as chemical mechanical planarization (CMP). The planarization process erodes a top portion of the dielectric material to create a uniform surface while improving the optical resolution of subsequent lithography steps. The interlayer dielectric layer 120 is formed to a thickness which corresponds to both the depth of the via interconnects 125 and trench interconnects 130. In one embodiment, the via interconnects 125 and trench interconnects 130 are formed by a damascene or dual-damascene process with copper using an electroplating process to fill recesses in the interlayer dielectric layers 120.

An interface dielectric 135 is formed over the interlayer dielectric layers 120, the via interconnections 125, and the trench interconnects 130. The interface dielectric 135 is formed from a dielectric film with barrier properties, such as a silicon nitride or silicon oxynitride film. In another embodiment, a spin-on polymer "buffer coat" is applied on top of the silicon nitride or silicon oxynitride film. The interface dielectric 135 is patterned and etched using methods known to one skilled in the art to form a pathway to an underlying trench interconnect 130 or via interconnect 125. A first seed layer 140 is formed over the interface dielectric 135 using a physical vapor deposition (PVD) process comprising one or more of copper (Cu), aluminum (Al), gold (Au), and nickel vanadium (NiV). In one embodiment, the first seed layer 140 thickness is generally in a range between 1500 to 5000 Angstroms. In another embodiment, a barrier layer is formed prior to depositing the first seed layer 140, to form a barrier seed stack. The barrier layer may be formed using a PVD process comprising one or more of titanium (Ti), tantalum (Ta), tantalum nitride (TaN), titanium nitride (TiN), and titanium tungsten (TiW). In one embodiment, the barrier layer thickness is generally in a range between 500 to 2000 Angstroms resulting in a barrier seed stack with a total film thickness approximately between 2000 to 7000 Angstroms.

A resist spin-expose-develop process is used to form a resist layer with a thick metal resist pattern, thereby forming resist over the first seed layer 140 while leaving a portion of the first seed layer 140 exposed for the formation of the first conductor 145. The first conductor 145, formed of a metal comprising Al, with a side surface 155 and a top surface 160 is formed on the first seed layer 140 using an electroplating process. As an example, the thickness of the first conductor layer 165 generally ranges between 1.5 to 20 microns.

In one embodiment, the first conductor 145 is electroplated using an aprotic electrolyte in the form of complex salt melts or organic solutions to form electrically conductive complex compounds with alkali metal halogens or hydrides, such as aluminum chloride and aluminum bromide, in an oxygen and moisture-free environment. Preferably, the aluminum electroplating process is performed in a bath with an inert atmosphere such as nitrogen or argon and is performed in a manner to allow the photoresist pattern to remain substantially unaffected during the process.

The resist used to define the location of the first conductor 145 is removed using a wet chemical resist stripper solution. The appropriate wet chemical resist stripper solution used is dependent upon the particular photoresist that is employed. As an example, if a polyimide-based photoresist such as FujiFilm's Durimide 7510 is used, then either NMP (n-methylpyrrolidone) at approximately 85 deg C. or Fujifilm's QZ 3322 polyimide stripper solution at approximately 70 deg C. may be used. Alternately, an oxygen-based plasma can be used to strip the resist, as is well-known in the art. The first seed layer 140 and barrier layer(s), if applicable, not masked by the first conductor 145 are etched using a self-aligning wet etch or a dry etch process. The process used to etch the first seed layer 140 and underlying barrier layer, if applicable, selectively etches the first seed layer 140 and underlying barrier layer while leaving the first conductor 145 and underlying interface dielectric 135 relatively unaffected. The appropriate etch chemistry depends upon the seed and barrier materials employed, As a representative example, if the seed layer is copper and the barrier layer is titanium, then a sulfuric acid/hydrogen peroxide mixture can be used to etch the copper seed layer and dilute hydrofluoric acid (HF) can be used to etch the barrier layer. A photodefinable dielectric layer 150 is applied to a desired thickness, in one embodiment, using a spin-on process. The thickness of the photodefinable dielectric layer 150 is dependent on the thickness of the first conductor 145 and the desired thickness of dielectric on top of the first conductor 145, but is typically in the range of 2.5 um to 25 um in one embodiment.

Figure 2:
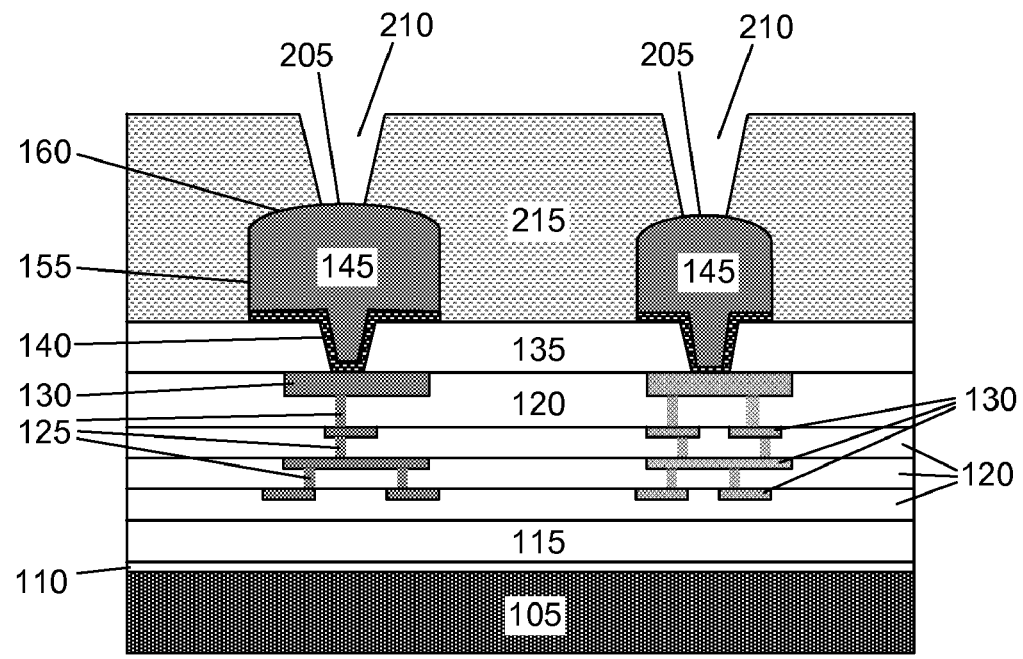
FIG. 2 illustrates the device in FIG. 1 after patterning the photodefinable dielectric layer to expose a top surface of a first conductor.

FIG. 2 illustrates the device 100 in FIG. 1 after eroding a portion of the photodefinable dielectric layer 150 to create an exposed conductor surface 205 through a conductor path 210 in a patterned photodefinable dielectric layer 215. In one embodiment, some areas of the photodefinable dielectric layer 150 are exposed to light to create a difference in the solubility of the dielectric material in the developer solution between the portions of the film that are exposed to light vs. the portions that are unexposed. Subsequently, the photodefinable dielectric is selectively removed using a developer solution to form the conductor path 210. The appropriate developer solution depends on the particular photodefinable dielectric material applied. As an example, aqueous tetramethylammonium hydroxide may be used for the developer, though other solvent-based or other proprietary formulations may be used. The developer selectively removes portions of the photodefinable dielectric layer 150 without significantly eroding or etching the first conductor 145 to form the patterned photodefinable dielectric layer 215.

After develop, the patterned photodefinable dielectric layer 215 is heated to cure the film. The appropriate cure conditions such as time, temperature and atmosphere are dependent on what photodefinable dielectric layer material is employed. The cured patterned photodefinable dielectric layer 215 may be planarized, or polished using a process such as chemical mechanical planarization (CMP). The planarization process erodes a top portion of the patterned photodefinable dielectric layer 215 to create a uniform surface while improving the optical resolution of subsequent lithography steps. In another embodiment, a portion of the photodefinable dielectric layer 150 is removed anisotropically, meaning that an etch rate in the direction normal to a surface is much higher than in a direction parallel to the surface. The portion of the photodefinable dielectric layer 150 may be eroded using an oxygen-based plasma.

Figure 3:
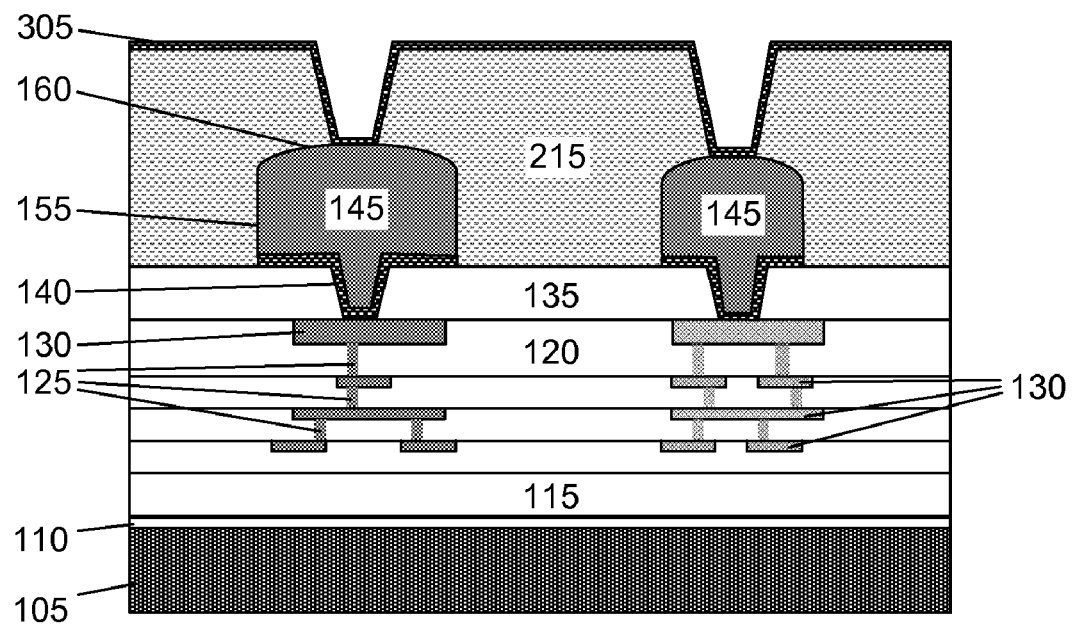
FIG. 3 illustrates the device in FIG. 2 after forming a seed layer on the patterned photodefinable dielectric layer and exposed conductor surfaces.

FIG. 3 illustrates the device in FIG. 2 after forming a second seed layer 305 on the patterned photodefinable dielectric layer 215 and the top surface 160 of the first conductor 145. The second seed layer 305 is formed using a physical vapor deposition (PVD) process comprising one or more of copper (Cu), aluminum (Al), gold (Au), and nickel vanadium (NiV). In another embodiment, a barrier layer is formed prior to depositing the second seed layer 305, to form a barrier seed stack. The barrier layer may be formed using a PVD process comprising one or more of titanium (Ti), tantalum (Ta), tantalum nitride (TaN), titanium nitride (TiN), and titanium tungsten (TiW).

Figure 4:
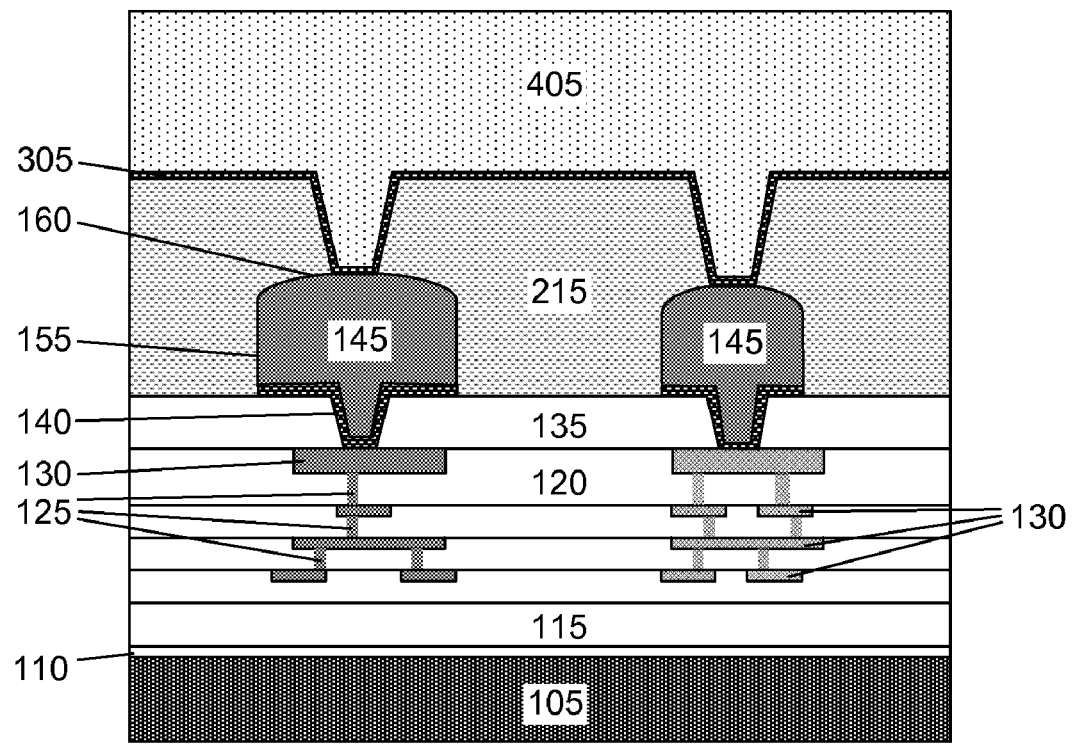
FIG. 4 illustrates the device in FIG. 3 after depositing a resist layer on the seed layer.
Figure 5:
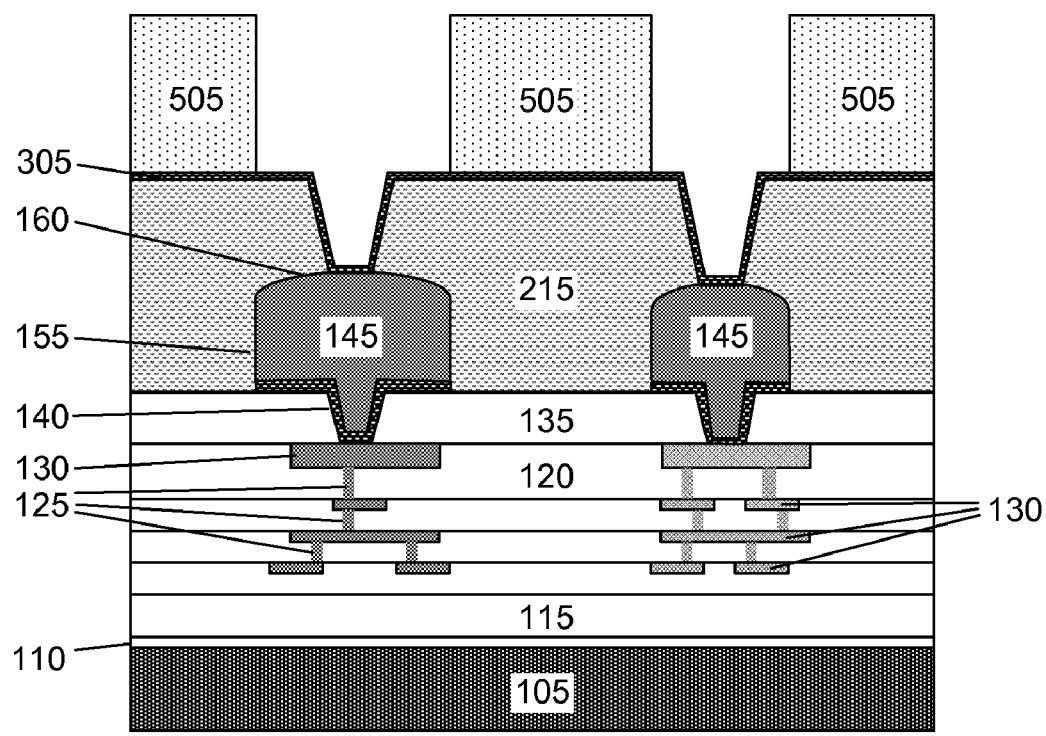
FIG. 5 illustrates the device in FIG. 4 after patterning the resist layer to mask portions of the seed layer.

FIG. 4 illustrates the device in FIG. 3 after depositing a resist layer 405 on the second seed layer 305. FIG. 5 illustrates the device in FIG. 4 after patterning the resist layer 405 to mask portions of the second seed layer 305 with a patterned resist layer 505. A resist spin-expose-develop process is used to form the patterned resist layer, forming resist over the second seed layer 305 while leaving a portion of the second seed layer 305 exposed for the formation of a second conductor, as shown in FIG. 6.

Figure 6:
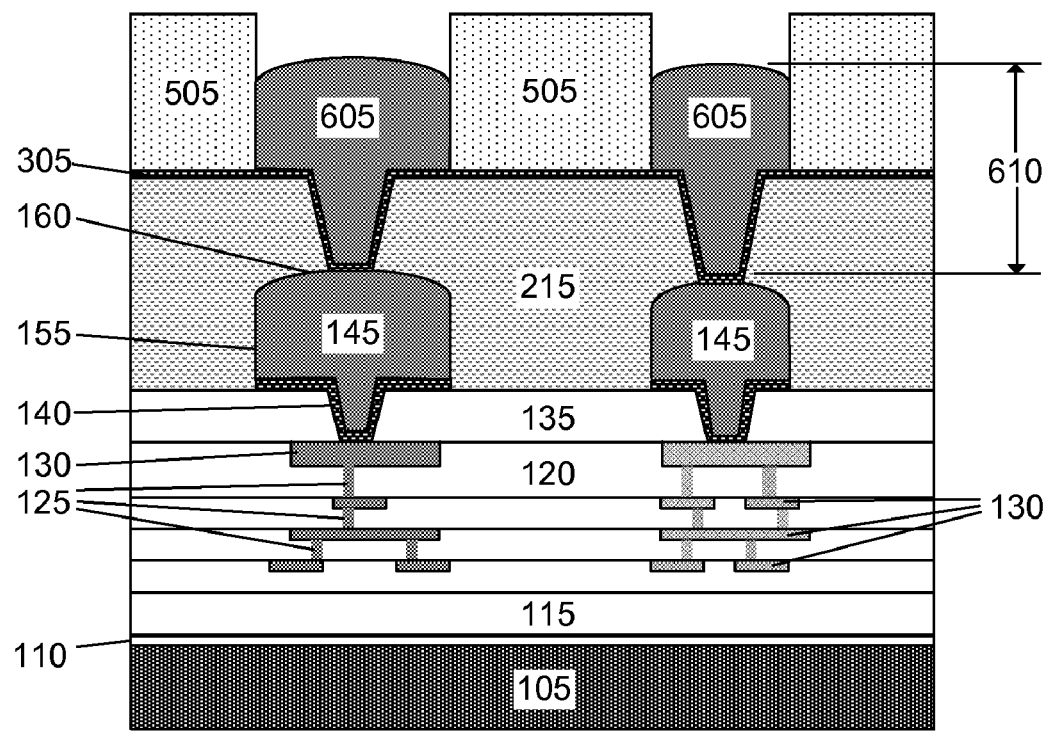
FIG. 6 illustrates the device of FIG. 5 after forming a second conductor in regions between the masked portions of the seed layer.

FIG. 6 illustrates the device of FIG. 5 after forming a second conductor 605 in regions between patterned resist layer 505. The second conductor 605 is formed on the second seed layer 305 using an electroplating process. In one embodiment, the second conductor 605 is electroplated using an aprotic electrolyte in the form of complex salt melts or organic solutions to form electrically conductive complex compounds with alkali metal halogens or hydrides, such as aluminum chloride and aluminum bromide, in an oxygen and moisture-free environment. Preferably, the electroplating process is performed in a bath with an inert atmosphere such as nitrogen or argon. As an example, a thickness of the second conductor layer 610 ranges approximately between 1.5 to 20 microns.

Figure 7:
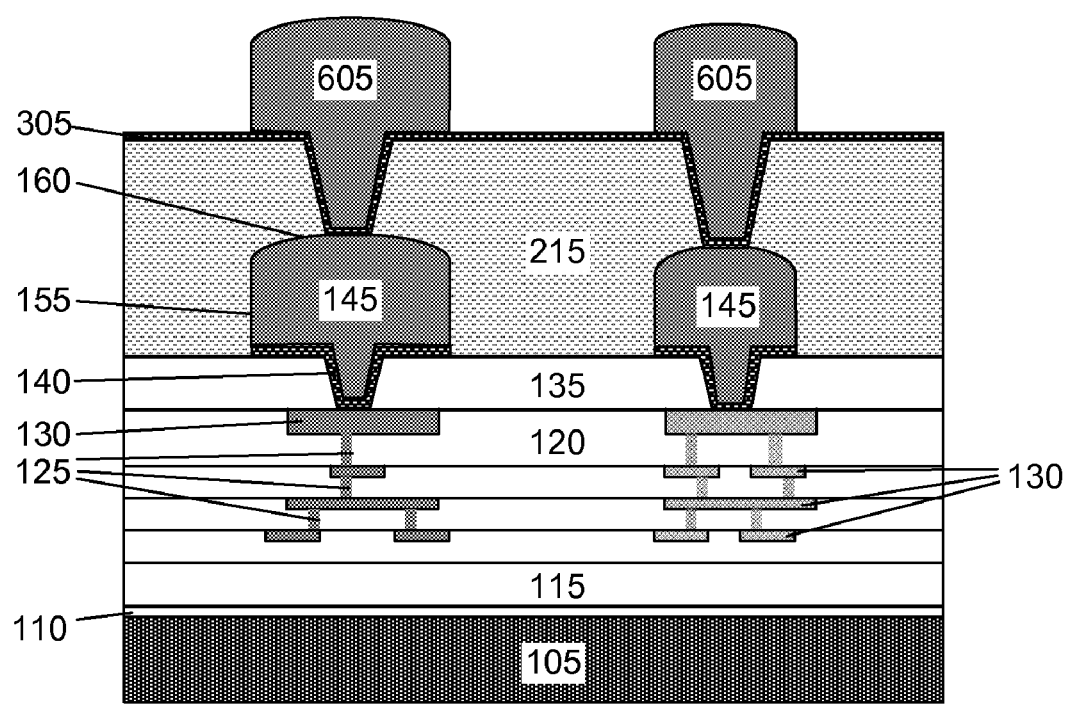
FIG. 7 illustrates the device of FIG. 6 after etching the resist layer.

The patterned resist layer 505 is removed to expose portions of the second seed layer 305 not covered by the second conductor 605, as shown in FIG. 7.

Figure 8:
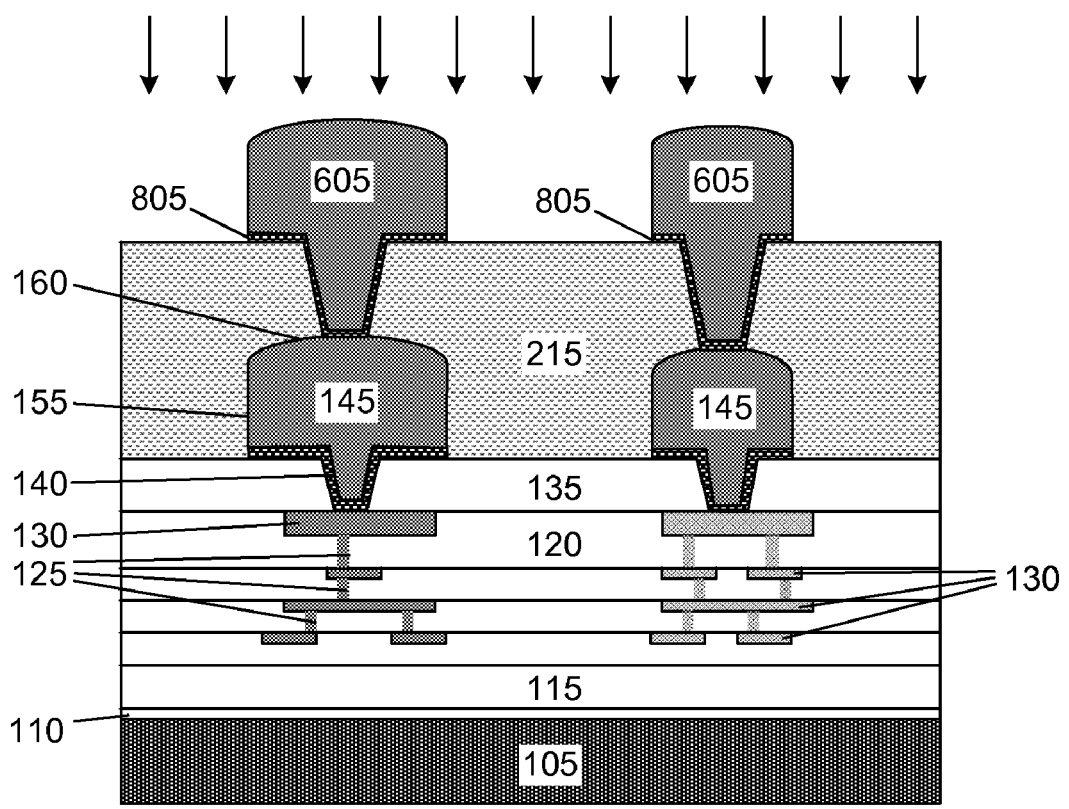
FIG. 8 illustrates the device of FIG. 7 after etching exposed portions of the second seed layer to remove the second seed layer not covered by the second seed layer.

The exposed portions of the second seed layer 305 are etched in FIG. 8 to substantially remove the second seed layer 305 (of FIG. 7) not covered by the second conductor 605. The second conductor 605 is formed of a self-passivating conductor. A self-passivating conductor is a conductor that becomes passivated when exposed to an oxygen source, such as air, to form an adherent oxide layer on its surface. For example, the self-passivating characteristic of aluminum provides a mechanism to provide a low temperature, including room temperature, passivation of the first conductor in the presence of a low thermal decomposition temperature photodefinable dielectric layer such as the patterned photodefinable dielectric layer 215 while avoiding a higher temperature passivation process, such as those used in PECVD or HDCVD processes.

Figure 9:
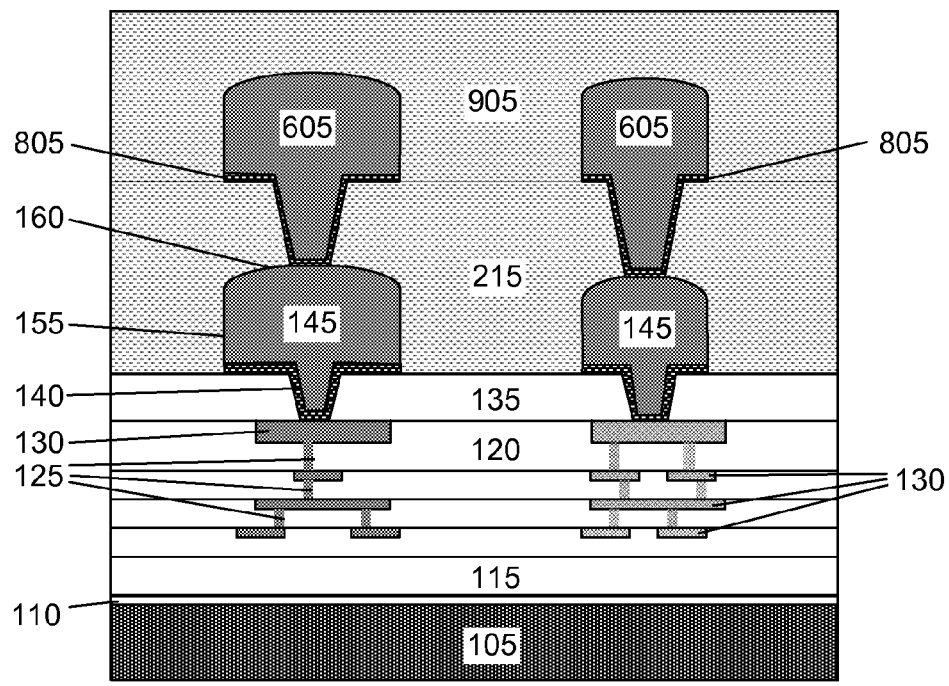
FIG. 9 illustrates the device of FIG. 8 after forming a second photodefinable dielectric layer on the patterned photodefinable dielectric layer and the second conductor.

In FIG. 9, a second photodefinable dielectric layer 905 is formed on the patterned photodefinable dielectric layer 215 and the second conductors 605. The second photodefinable dielectric layer 905 may be a same source material as the dielectric material used to form the patterned photodefinable dielectric layer 215 or it may be a different photodefinable dielectric material used to electrically isolate conductors and reduce resistance capacitance ("RC") delay and improve device performance. The process as illustrated in FIGS. 2-9 may be repeated one or more times to provide a plurality of additional conductors.

Figure 10:
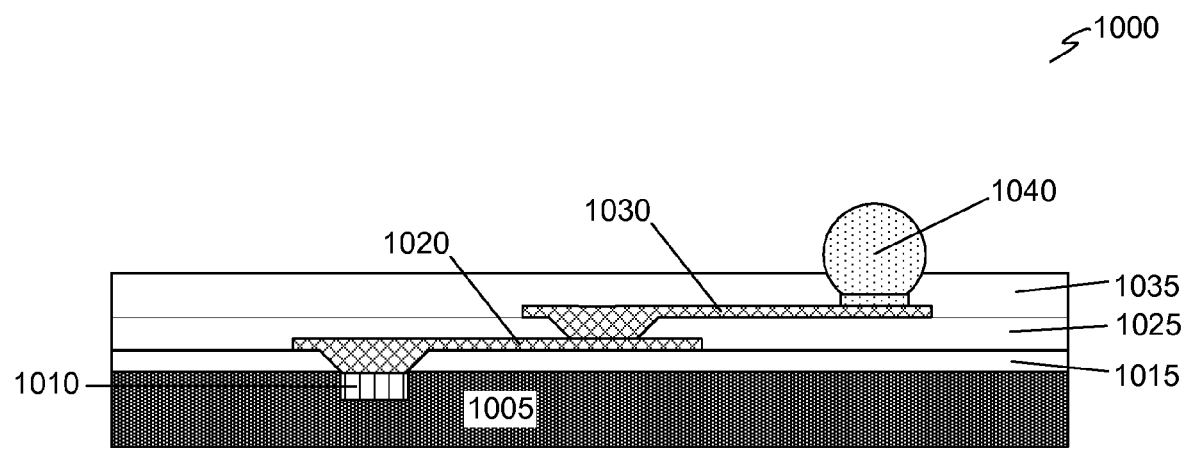
FIG. 10 illustrates another embodiment of a device fabricated with thick metal interconnect structures.

FIG. 10 illustrates another embodiment of a device 1000 fabricated with thick metal interconnect structures. In this embodiment, a workpiece 1005 with a conductor pad 1010 and a passivation layer 1015 formed on the workpiece 1005. The workpiece 1005 comprises silicon, gallium arsenide (GaAs), or indium antimonide (InSb) in monocrystalline form. The conductor pad 1010 is formed of a metal using a sputtering process or another metal deposition process known to one skilled in the art. The passivation layer 1015 may be formed using a thermal deposition, plasma enhanced chemical vapor deposition (PECVD), or high density chemical vapor deposition (HDCVD) process. A first self-passivating conductor 1020 comprising a metal such as aluminum is formed adjacent to a first low thermal decomposition temperature dielectric layer 1025. A second self-passivating conductor 1030 is formed in contact with the first self-passivating conductor 1020 to form a conductive path through the conductor pad 1010 to the workpiece 1005. A second low thermal decomposition temperature dielectric layer 1035 is formed adjacent to the second self-passivating conductor 1030. The first low thermal decomposition temperature dielectric layer 1025 and the second low thermal decomposition temperature dielectric layer 1035 are formed of photodefinable dielectric layer materials used to electrically isolate conductors and reduce resistance capacitance ("RC") delay and improve device 1000 performance.

The first self-passivating conductor 1020 and the second self-passivating conductor 1030 may be formed using an electroplating process known to one skilled in the art. A solder ball 1040 may be formed using a solder ball placement process known to one skilled in the art.

Figure 11:
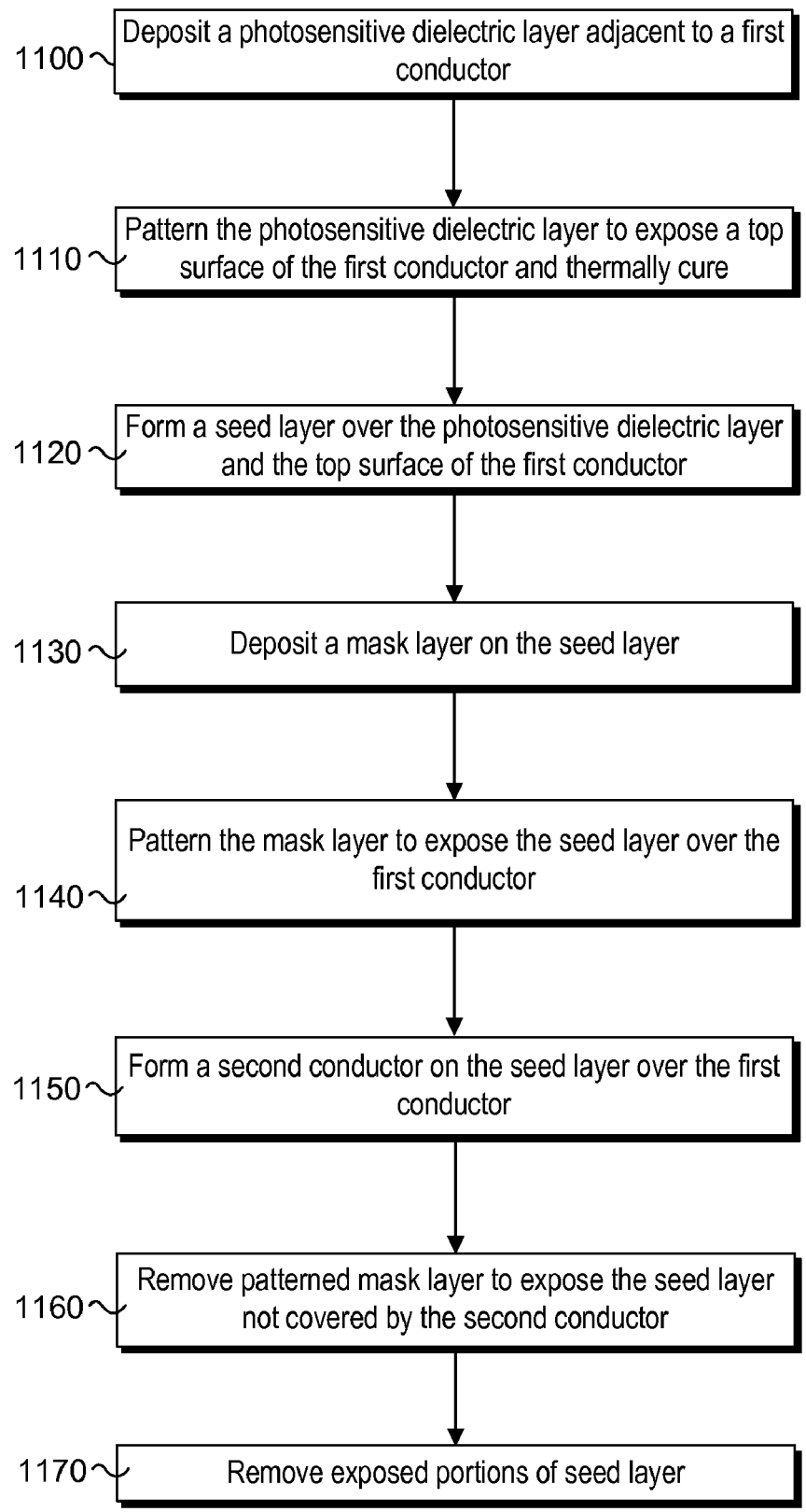
FIG. 11 is a flowchart describing one embodiment of a fabrication process used to form thick metal interconnect structures.

FIG. 11 is a flowchart describing one embodiment of a fabrication process used to form thick metal interconnect structures. In element 1100, a photodefinable dielectric layer 150 is deposited adjacent to a first conductor 145. In element 1110, the photodefinable dielectric layer 150 is patterned to expose a top surface 160 of the first conductor 145 and thermally cured using methods known to one skilled in the art. A second seed layer 305 is formed over the cured patterned photodefinable dielectric layer 215 and the top surface 160 of the first conductor 145 in element 1120. In element 1130, a resist layer 405 is deposited on the second seed layer 305. In element 1140, the resist layer 405 is patterned to expose the second seed layer 305 over the first conductor 145. A second conductor 605 is formed on the second seed layer 305 over the first conductor 145 in element 1150. In element 1160, the patterned resist layer 505 is removed to expose the second seed layer 305 not covered by the second conductor 605. In element 1170, the exposed portions of the second seed layer 305 are removed.

In this embodiment, the first conductor 145 and the second conductor 605 are formed of a self-passivating conductor comprising Al, with a side surface 155 and a top surface 160 is formed on the first seed layer 140 using an electroplating process. The first conductor 145 and the second conductor 605 are electroplated using an aprotic electrolyte in the form of complex salt melts or organic solutions to form electrically conductive complex compounds with alkali metal halogens or hydrides, such as aluminum chloride and aluminum bromide, in an oxygen and moisture-free environment. Preferably, the aluminum electroplating process is performed in a bath with an inert atmosphere such as nitrogen or argon and is performed in a manner to allow the photoresist pattern to remain substantially unaffected during the process.

A plurality of embodiments of an apparatus and methods for forming thick metal interconnect structures have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit, comprising:
   a first conductor having a top surface and a side surface;
   a first photodefinable dielectric layer adjacent to the side surface of the first conductor;
   a seed layer over the top surface of the first conductor and over the first photodefinable dielectric layer;
   a second conductor on the seed layer; and
   a second photodefinable dielectric layer adjacent to the second conductor.

2. The integrated circuit of claim 1, wherein the seed layer is selected from the group consisting of Cu, Al, Au, and NiV.

3. The integrated circuit of claim 1, wherein the first conductor and second conductor comprise aluminum.

4. The integrated circuit of claim 1, wherein the first conductor and the second conductor is formed using an electroplating process.

5. The integrated circuit of claim 1, wherein the photodefinable dielectric layers are thermally cured.

6. The integrated circuit of claim 1, wherein a thickness of the first conductor and a thickness of the second conductor is approximately between 1.5 to 20 microns.

* * * * *